United States Patent
Miyazaki

(10) Patent No.: US 7,205,669 B2
(45) Date of Patent: Apr. 17, 2007

(54) SEMICONDUCTOR DEVICE

(75) Inventor: Takashi Miyazaki, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/378,651

(22) Filed: Mar. 20, 2006

(65) Prior Publication Data
US 2006/0214275 A1 Sep. 28, 2006

(30) Foreign Application Priority Data
Mar. 22, 2005 (JP) .............................. 2005-082374

(51) Int. Cl.
H01L 23/48 (2006.01)
H01L 23/52 (2006.01)
H01L 29/40 (2006.01)

(52) U.S. Cl. .................... 257/777; 257/789; 257/793; 257/795; 257/E23.169

(58) Field of Classification Search .................... None
See application file for complete search history.

(56) References Cited

U.S. PATENT DOCUMENTS 4,818,728 A * 4/1989 Rai et al. .................... 438/108
5,898,223 A * 4/1999 Frye et al. ................... 257/777
6,016,013 A * 1/2000 Baba .......................... 257/778
6,425,516 B1 * 7/2002 Iwatsu et al. ........... 228/180.22
6,555,917 B1 * 4/2003 Heo ........................... 257/777
2005/0214971 A1 * 9/2005 Hung ......................... 438/106

FOREIGN PATENT DOCUMENTS

JP 2003-324182 11/2003

* cited by examiner

Primary Examiner—Jasmine Clark
(74) Attorney, Agent, or Firm—Young & Thompson

(57) ABSTRACT

A semiconductor device that exhibits an enhanced inhibition to a generation of voids in an underfill resin for encapsulation supplied between a semiconductor chip and an electronic component, which are mutually coupled through bump electrodes. The semiconductor device includes a first semiconductor chip and a second semiconductor chip, wherein bumps-formed surface of the first semiconductor chip is opposed to bumps-formed surface of the electronic component. The semiconductor device includes insulating films that function as protective films respectively formed on an uppermost surface of the first semiconductor chip and on an uppermost surface of the electronic component. Openings for supplying an underfill resin between the first semiconductor chip and the second semiconductor chip are provided in the vicinity of the bumps-formed regions of at least one of the insulating films.

16 Claims, 9 Drawing Sheets

SEMICONDUCTOR DEVICE

This application is based on Japanese patent application No. 2005-82,374, the content of which is incorporated hereinto by reference.

BACKGROUND

1. Field of The Invention

The present invention relates to a semiconductor device, and particularly relates to a semiconductor device comprising a semiconductor chip and bump electrodes, in which the semiconductor chip is coupled to an electronic component including a semiconductor chip via the bump electrode so that the semiconductor chip is opposed to the electronic component, and the bump electrode is encapsulated with an underfill composed of an insulating resin.

2. Related Art

In recent years, under circumstances of an enhanced integration and an enhanced processing rate for a semiconductor device, a chip-on-chip (COC) coupling technology that involves coupling different chips through an bump electrode by the shortest paths is expected in terms of achieving a practical realization thereof, which can provide creating a high-speed system composed of different LSI devices with lower cost that requires shorter time for the development.

Further, in chips employed for creating the COC coupling, an increased number of pins for providing a coupling to other devices are required, under circumstances of an increasing demand for an enhanced miniaturization and sophistication of semiconductor devices, and therefore reductions in an interval between chips and a dimensional shrinkage of bumps are achieved. This simultaneously causes reducing an interval between upper and lower chips and reducing a geometry of a spacing between bumps, and therefore it is difficult to inject an insulating underfill resin between the bump and the chip. Further problems may be caused in such configuration that air bubbles are easily generated in the resin (i.e., generating voids), and the generated air bubbles are difficult to be eliminated.

Further problem may be caused when an insulating film such as polyimide (PI) film is formed in an area except the bumps-formed region, in order to provide a protection to surface of the chip from the outside. The presence of such insulating film may provide a reduced gap between the upper chip and the lower chip and/or may provide a deteriorated flowability of the underfill resin that is in contact with the insulating film, blocking an approach of the underfill resin particularly in a stepped portion of the insulating film, and therefore there is a fear that peripheral portions of the bump are not suitably filled with the underfill resin.

Japanese Patent Laid-Open No. 2003-324,182 discloses a technology that aims for preventing a generation of voids in the underfill resin during an injection of the resin for the COC structure, in which the underfill resin is supplied between the upper chip and the lower chip that are mutually coupled. In general, when the interval between the upper and the lower chips is increased, a positional deviation in the distribution of the entering speed of the underfill resin is ordinarily increased and in particular, a tendency of providing lower flow rate in a region closer to the center of the chip and higher flow rate in a region closer to the outside of the chip is presented. This tendency causes the change of flow of the underfill resin entering in the outer region, so that the flow is detoured to the central region, thereby encapsulating air within the resin to create voids therein. On the contrary, according to the above-described conventional technology, the flow rates of the resin in respective regions are adjusted to be harmonized, thereby preventing the generation of voids.

In the meantime, when the interval between the upper and the lower chips is further reduced for achieving higher miniaturization of the semiconductor device, the flow rate of the resin around the bumps-formed region may be particularly decreased during the supply of the underfill resin, resulting in a generation of voids around the bumps-formed region due to bubbles mixed therein. Further, it is confirmed by the present inventors that a cycle of an expansion and a shrinkage of voids that have been generated around the bumps-formed region are repeated during the temperature cycle test for evaluating a reliability of devices, promoting a stress exerted on the bumps-formed region, such that there is a fear that both of semiconductor chips joined to certain portions of the bumps-formed region are eliminated therefrom.

Concerning the above-described fear, although the technology described in Japanese Patent Laid-Open No. 2003-324,182 addresses a certain solution for avoiding the encapsulation of voids within the device-forming region of the COC structure, no solution for voids possibly generated due to bubbles being mixed around the bumps-formed region is presented.

SUMMARY OF THE INVENTION

According to one aspect of the present invention, there is provided a semiconductor device, comprising a first semiconductor chip having bumps on a surface thereof and an electronic component having bumps on a surface thereof, bumps-formed surface of the first semiconductor chip being opposed to bumps-formed surface of the electronic component, wherein the semiconductor device comprises protective films respectively formed on an uppermost surface of the first semiconductor chip and on an uppermost surface of the electronic component, and wherein an opening for supplying an underfill resin between the first semiconductor chip and the electronic component is provided in vicinity of the bumps-formed region of at least one of the protective films.

According to the semiconductor device of the present invention, the flow of the underfill resin is assisted in the bumps-formed region by providing the opening for supplying the underfill resin into the region between the first semiconductor chip and the electronic component, in vicinity of the bumps-formed region on the protective film of either one of the first semiconductor chip and the electronic component, so that generation of voids in the underfill resin supplied for encapsulation between the semiconductor chip and the electronic component can be inhibited.

The semiconductor device having the above-described configuration may be further configured that the opening passes through the bumps-formed region and extends from one end to the other end of the semiconductor chip or the electronic component having the opening therein.

Having such configuration, the flow of the underfill resin is further assisted in the bumps-formed region, such that generation of voids in the underfill resin for encapsulation supplied between the semiconductor chip and the electronic component can be further inhibited.

The semiconductor device having the above-described configuration may be further configured that the opening is provided to pass through the bumps-formed region and to have a geometry that is larger than and covers a region corresponding to a region extending one end to the other end of the semiconductor chip or the electronic component, which is the other one of the semiconductor chip or the electronic component having the opening therein, and may also be further configured that both of the semiconductor chip and the electronic component are provided with openings.

Having such configuration, the flow of the underfill resin is further assisted in the bumps-formed region, such that generation of voids in the underfill resin for encapsulation supplied between the semiconductor chip and the electronic component can be further inhibited.

According to the present invention, a semiconductor device that exhibits an enhanced inhibition to a generation of voids in an underfill resin for encapsulation supplied between a semiconductor chip and an electronic component, which are mutually coupled through bump electrodes, can be provided.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments concerning methods for manufacturing semiconductor devices according to the present invention will be described as follows in further detail, in reference to the annexed figures. In all figures, identical numeral is assigned to an element commonly appeared in the figures, and the detailed description thereof will not be presented.

First Embodiment

Figure 1A:
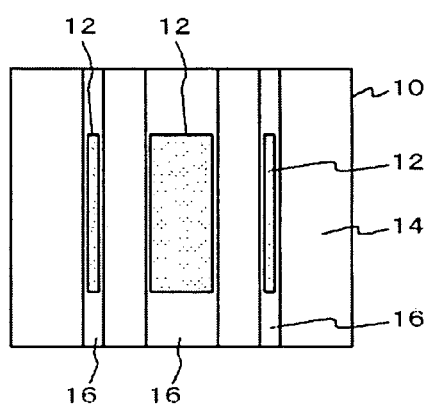
FIGS. 1A and 1B are plan views, illustrating a substantial part of a semiconductor device according to an embodiment.
Figure 1B:
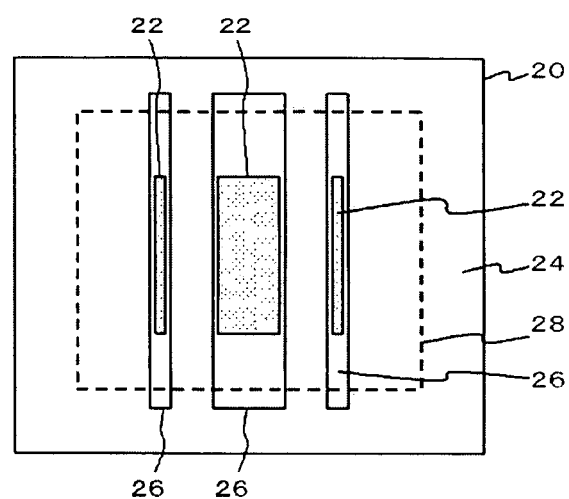

FIGS. 1A and 1B are plan views, illustrating a substantial part of a semiconductor device according to first embodiment. More specifically, FIG. 1A is a plan view of a first semiconductor chip including an enlarged view of an area around bumps-formed region before forming a junction, and FIG. 1B is a plan view of a second semiconductor chip that is an electronic component including an enlarged view of an area around bumps-formed region before forming a junction.

A semiconductor device according to the present embodiment comprises a first semiconductor chip 10 having bumps on a surface thereof and a second semiconductor chip 20 that is an electronic component having bumps on a surface thereof, where bumps-formed surface of the first semiconductor chip is opposed to bumps-formed surface of the electronic component, wherein the semiconductor device comprises insulating films 14 and 24 that functions as protective films, respectively formed on an uppermost surface of the first semiconductor chip 10 and on an uppermost surface of the electronic component, and wherein openings 16 and 26 for supplying an underfill resin between the first semiconductor chip 10 and the second semiconductor chip 20 is provided in vicinity of the bumps-formed regions 12 and 22 of at least one of the insulating films 14 and 24, respectively.

The first semiconductor chip 10 and the second semiconductor chip 20 include device-forming regions (not shown) and bumps-formed regions 12 and 22, respectively, and interlayer insulating films (not shown) are provided to cover these regions, respectively, and further insulating films 14 and 24 such as polyimide are further provided, respectively, though the detail thereof is not shown.

As shown in FIG. 1A, an opening 16 is provided to pass through the bumps-formed region 12, and to extend from one end to the other end of the first semiconductor chip 10 that has the openings 16 provided therein. On the contrary, as shown in FIG. 1B, the openings 26 pass through the bumps-formed region 22 and is provided to have a geometry that is larger than and covers a region corresponding to a region extending from one end to the other end of the first semiconductor chip 10 which is the counterpart of the second semiconductor chip 20 having the openings 26 therein. Further, the first semiconductor chip 10 are coupled to the second semiconductor chip 20 so as to superpose one of the respective bumps-formed regions 12 and 22 above the other thereof, in a device-mounting region 28 of the second semiconductor chip 20.

Figure 2:
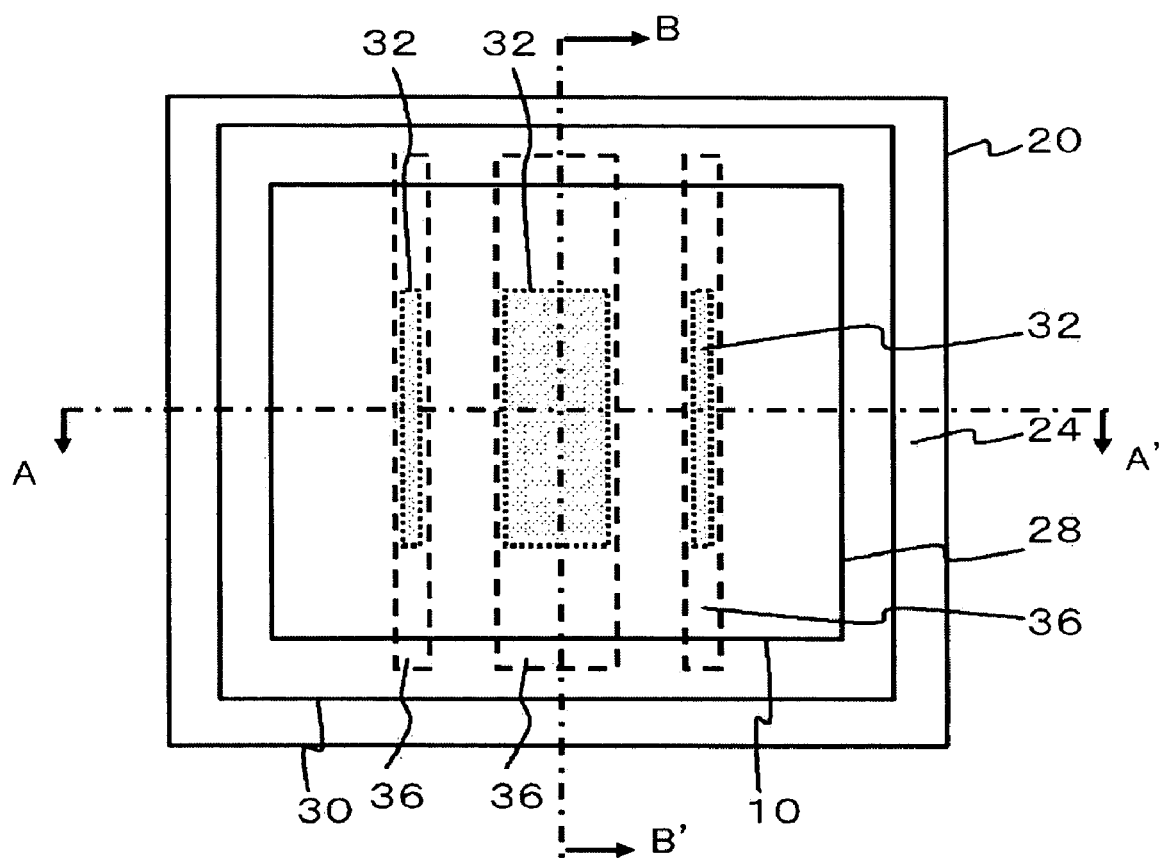
FIG. 2 is a plan view illustrating a substantial part of the semiconductor device according to the embodiment when both semiconductor chips are coupled to form a COC structure.

FIG. 2 is a plan view illustrating a substantial part of the semiconductor device according to the present embodiment when both semiconductor chips are coupled to form a COC structure. As shown in FIG. 2, in the semiconductor device, the first semiconductor chip 10 is mounted on a device-mounting region 28 on the second semiconductor chip 20 so as to mutually face the respective bump-formed surfaces thereof, and in the semiconductor device includes bumps-formed regions 32 encapsulated with an underfill resin 30 and an openings 36 encapsulated with the underfill resin 30.

Figure 3A:
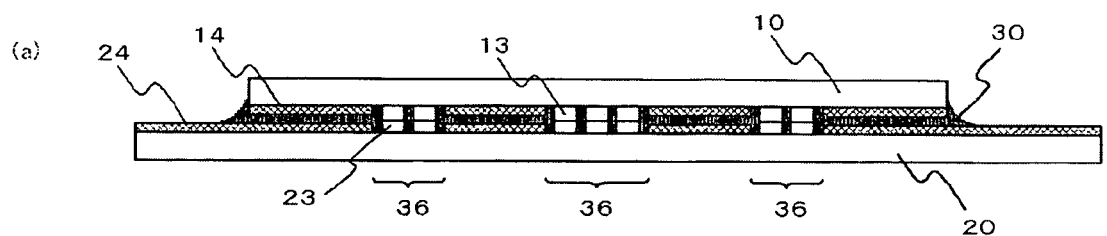
FIG. 3A and FIG. 3B are cross-sectional views along line A–A' and along line B–B' in the COC structure shown in FIG. 2, respectively.
Figure 3B:
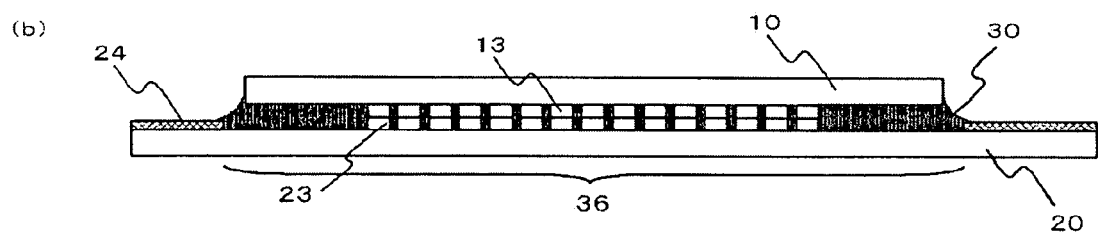

FIG. 3A is a cross-sectional view along line A–A' in the COC structure shown in FIG. 2, and FIG. 3B is a cross-sectional view along line B–B' in the COC structure shown in FIG. 2.

In this COC structure, the underfill resin 30 for encapsulation is located between the first semiconductor chip 10 and the second semiconductor chip 20. More specifically, as shown in FIG. 3A and FIG. 3B, an encapsulation with the underfill resin 30 between the insulating film 14 of the first semiconductor chip 10 and the insulating film 24 of the second semiconductor chip 20 is achieved. Further, concerning the openings 36 formed by overlapping the openings 16 of the first semiconductor chip 10 and the openings 26 of the second semiconductor chip 20, in the bumps-formed region 12 and 22, the bumps 13 formed in the first semiconductor chip 10 is opposed to the bumps 23 formed in the second semiconductor chip 20, and vacant spaces are created in portions having no bump formed therein, so that the underfill resin 30 can be supplied into the vacant portions. While an arrangement of the bumps 23 is configured to present "two rows-three rows-two rows" in FIG. 3A, it is not intended to particularly limit to this arrangement, and a desired arrangement may also be employed as required.

Here, the encapsulation with the underfill resin 30 between the first semiconductor chip 10 having the bumps and the second semiconductor chip 20 having the bumps that are coupled to the bumps of the first semiconductor chip 10 will be described.

FIG. 4 to FIG. 7 are plan views, stepwise illustrating a status of penetrating the underfill resin. Although no description on the first semiconductor chip 10 is presented for the purpose of simplifying the illustration in these figures and thus it is described that only the surface of the second semiconductor chip 20 is utilized for supplying the resin, the resin is also equally penetrated in the side of the first semiconductor chip 10.

Figure 4:
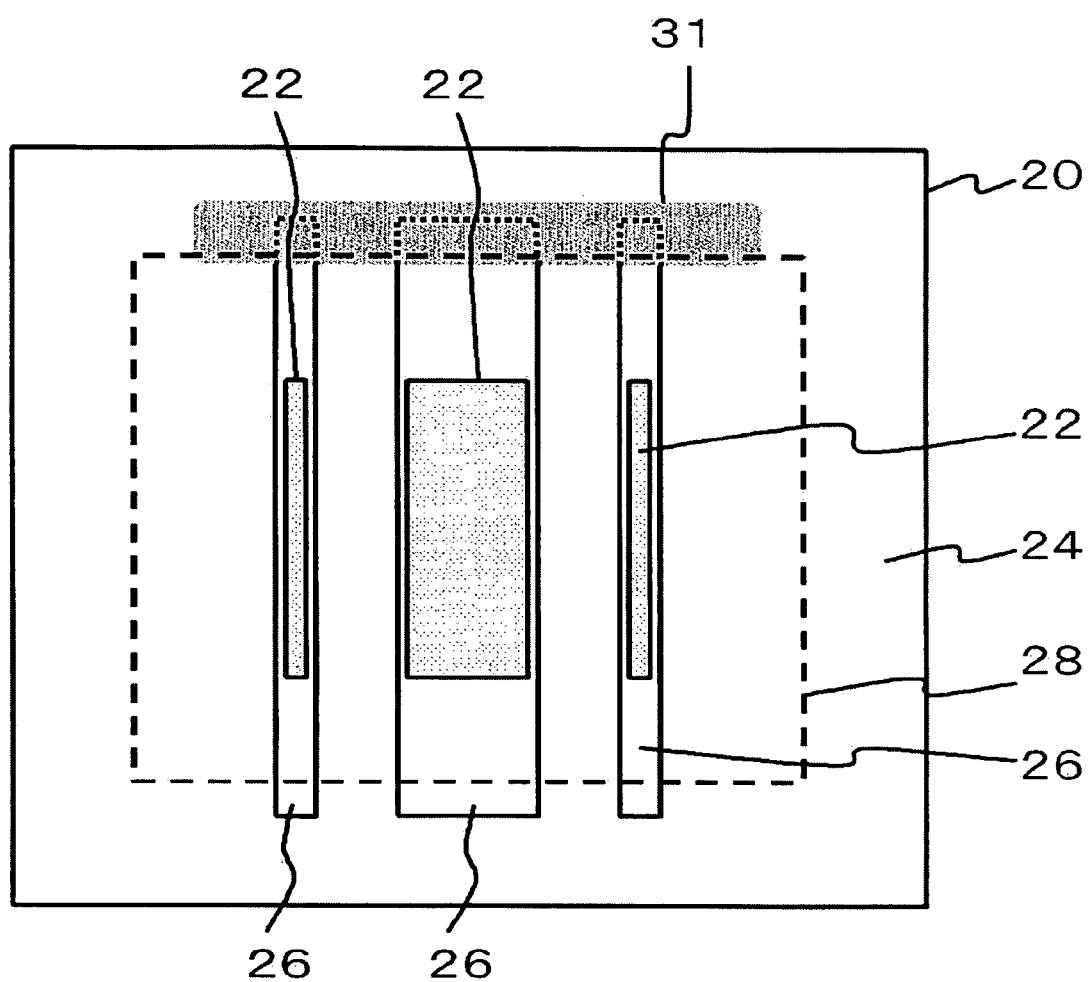
FIG. 4 is a plan view, illustrating a status of penetrating the underfill resin.
Figure 5:
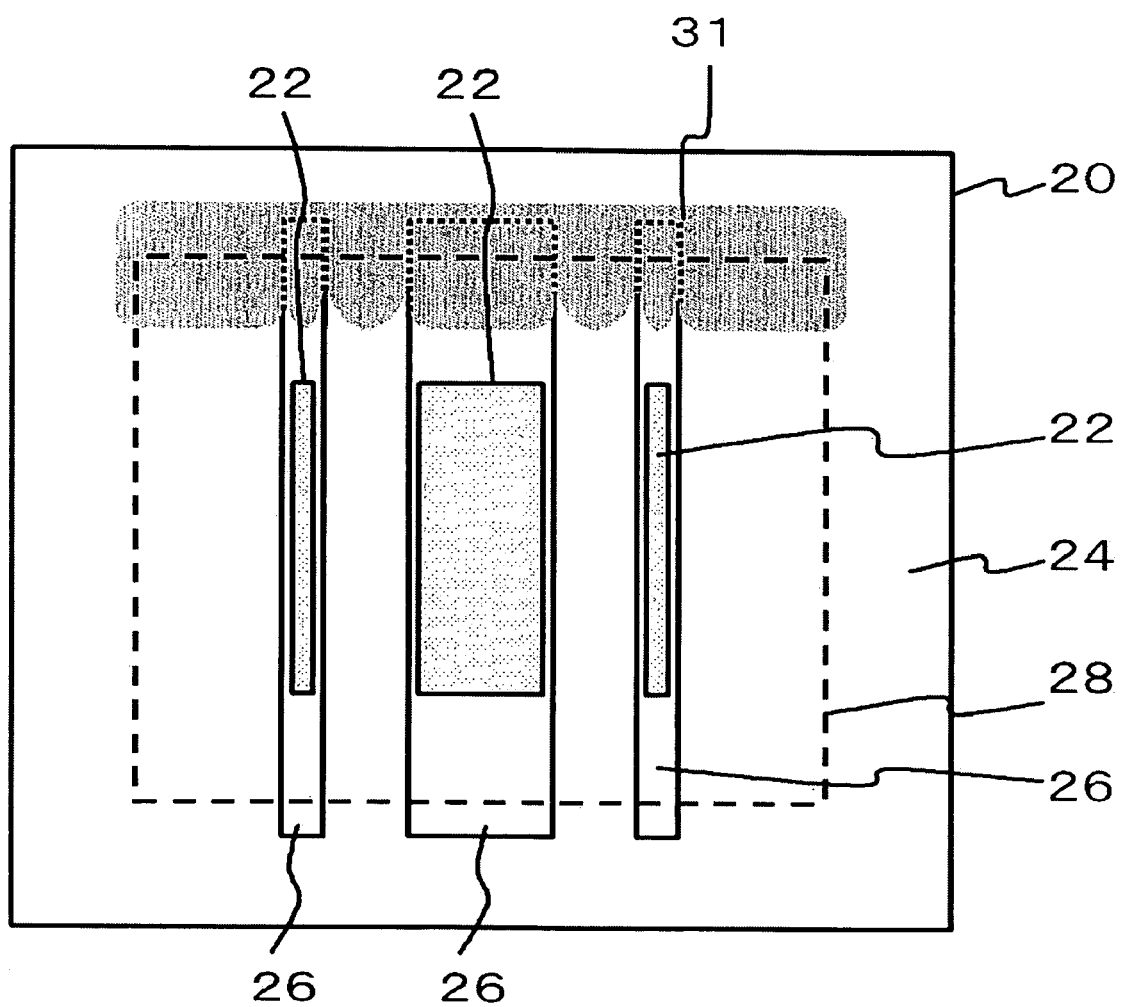
FIG. 5 is a plan view, illustrating a status of penetrating the underfill resin.
Figure 6:
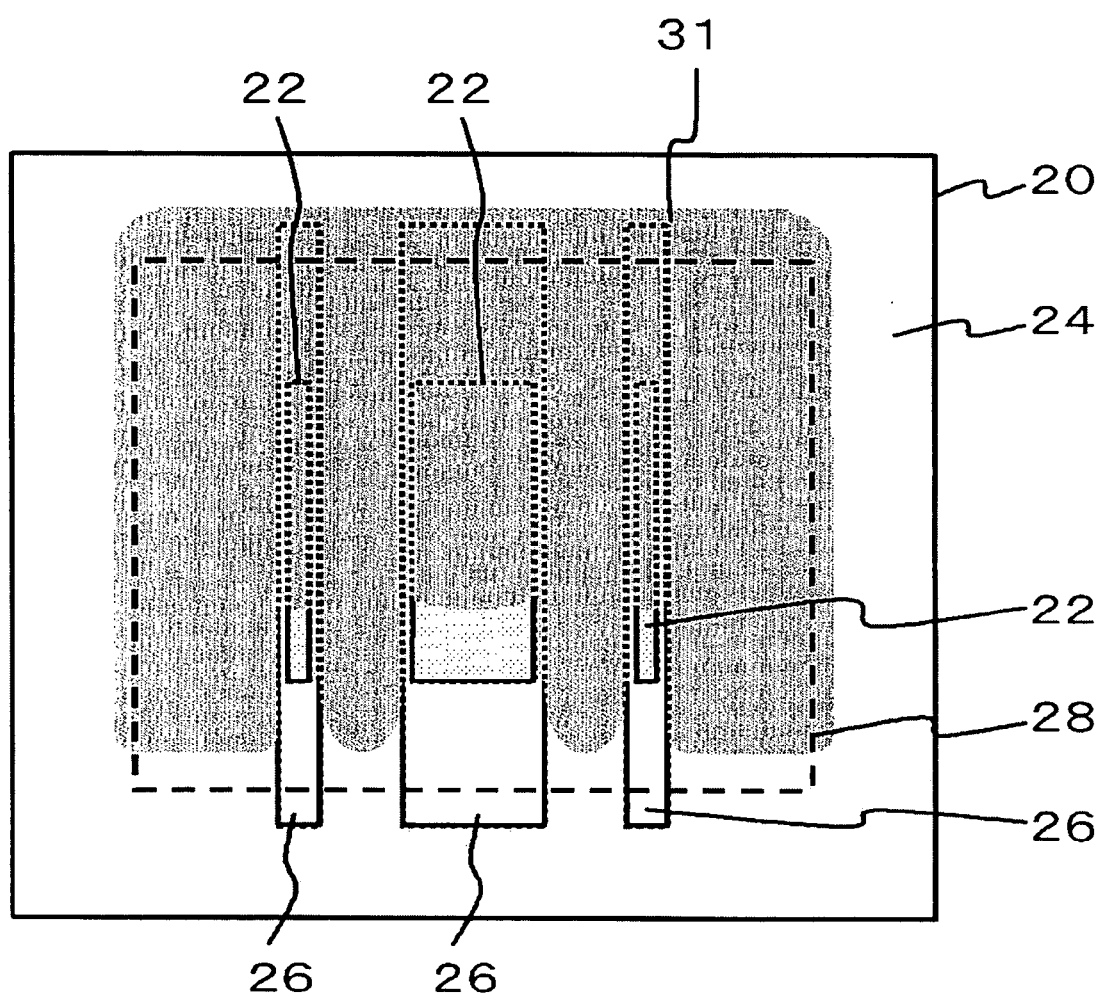
FIG. 6 is a plan view, illustrating a status of penetrating the underfill resin.
Figure 7:
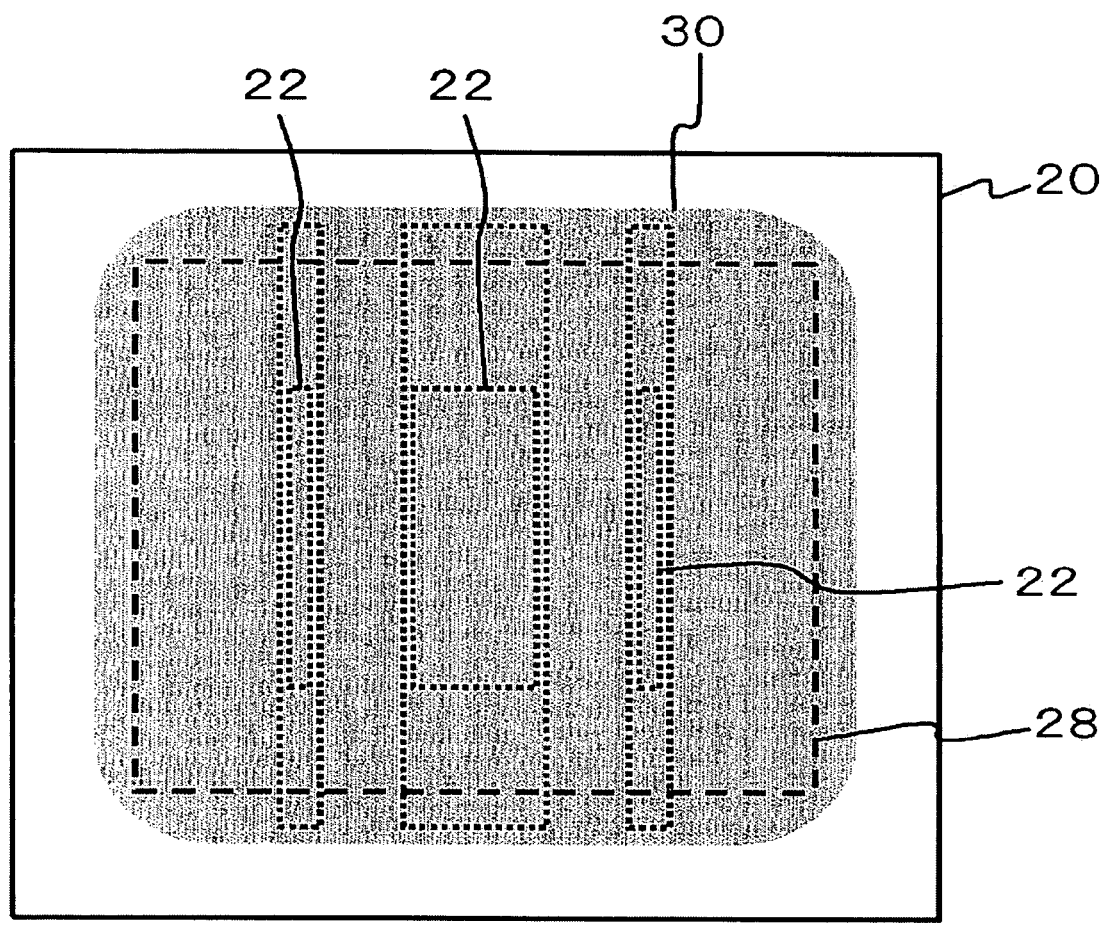
FIG. 7 is a plan view, illustrating a status of penetrating the underfill resin.

In a step illustrated in FIG. 4, a resin 31 is introduced in a resin inflow unit, which is provided in an insulating film located in an end of a device mounting regions 28, thereby commencing the penetration of the resin. In this case, the penetration of the resin 31 can be accelerated by heating the resin 31 to a temperature for providing a fused condition. In a step illustrated in FIG. 5, the resin 31 penetrates toward the end of the opposite side of the device mounting region 28 by a capillary phenomenon, so that the penetration of the resin 31 in the surface of insulating film 24 and in the opening 26 proceeds. In a step illustrated in FIG. 6, resin 31 is further fluidized into the bumps-formed region 22, and further the penetration of the resin 31 in the insulating film 24 in the device mounting region 28 and in the opening 26 further proceeds. In a step illustrated in FIG. 7, the entire device mounting region 28 is filled with the resin 31, and thus the supply of the resin is finished, and then, the resin is cured by heating to form the underfill resin 30.

In addition to above, when the intervals of the bumps in the bump-arrangement is narrower, air may possibly be remained in the side of the down stream along the moving direction of the resin in the opening 26 during the fluidization of the resin 31 within the device mounting region 28. For solving the problem, the opening 26 is designed to extend to the end of the device mounting region 28 and not to be ended within the inside of the device mounting region 28, such that the opening 26 opens to the end of the coupling surfaces of the first and the second semiconductor chips.

In such configuration, the air can be easily removed via a defoaming process such as, for example, a vacuum defoaming process, before conducting the thermal cure process. Further, though it is not shown, when air is entrapped in the inside of the opening 16 of the first semiconductor chip 10, the air can also be easily eliminated by a defoaming process before the thermal cure process in the similar way.

Since the flowability of the underfill resin in the bumps-formed region is enhanced by employing the above-described configuration of the present embodiment, a generation of voids in the underfill resin for providing the encapsulation between the semiconductor chip and the electronic component can be inhibited.

Second Embodiment

Figure 8A:
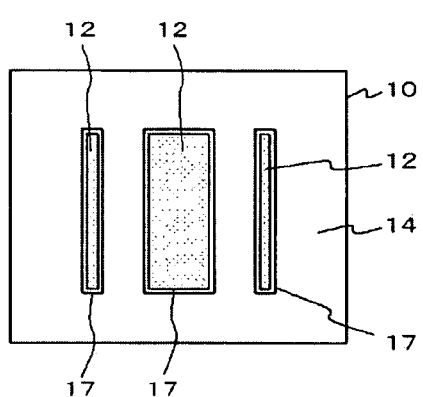
FIGS. 8A and 8B are plan views, illustrating a substantial part of a semiconductor device according to an embodiment.
Figure 8B:
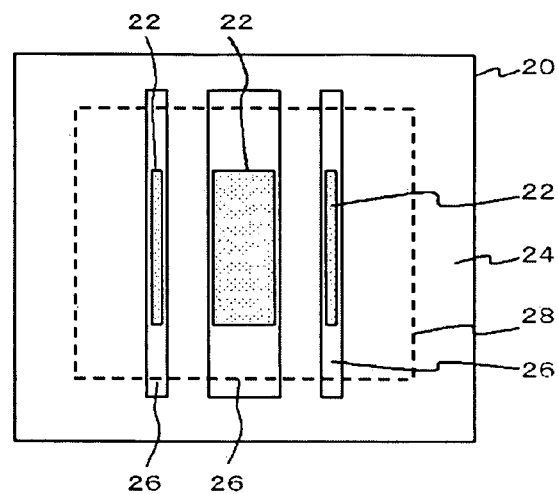

FIGS. 8A and 8B are plan views, illustrating a substantial part of a semiconductor device according to second embodiment. More specifically, FIG. 8A is a plan view including an enlarged view of a region around bumps-formed region before forming a junction with a first semiconductor chip, and FIG. 8B is a plan view including an enlarged view of a region around bumps-formed region before forming a junction with a second semiconductor chip that is an electronic component.

A semiconductor device of the present embodiment has similar configurations as employed in first embodiment in terms of the configuration of the second semiconductor chip 20, the filling with the underfill resin for the encapsulation or the like, except that openings 17 provided in an insulating film 14 of the first semiconductor chip 10 as shown in FIG. 8A are provided only on bumps-formed regions 12, and is not provided so as to pass through the bumps-formed region 12 and extend from an end to another end of the first semiconductor chip 10.

Even though the configuration described above is employed, an opening 26 formed in the second semiconductor chip 20 passes through the bumps-formed region 22, and is provided to have a geometry that is larger than and covers a region corresponding to a region extending from one end to the other end of a counterpart of the second semiconductor chip 20 having the opening 26 provided therein, or namely the first semiconductor chip 10, as shown in FIG. 8B. Accordingly, the opening 26 is designed to have its end, which extends to the end of the device mounting region 28 and is not ended within the inside of the device mounting region 28, such that the opening 26 opens to the end of the coupling surfaces of the first and the second semiconductor chips, similarly as in first embodiment. In such configuration, even if air is entrapped in either region of the openings 17 and 26, the air can be easily removed via a defoaming process such as, for example, a vacuum defoaming process before conducting the thermal cure process. Further, since the size of opening in the insulating film that functions a protective film is reduced, as compared with the semiconductor device of first embodiment, a protected area therewith can be increased, thereby providing further improved reliability of the semiconductor device.

Third Embodiment

Figure 9A:
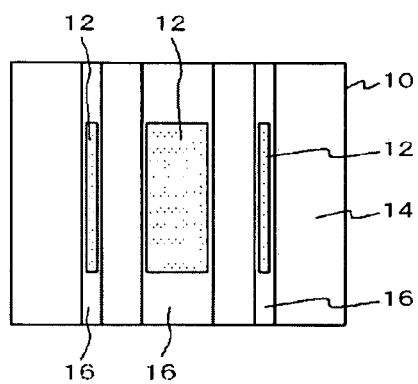
FIGS. 9A and 9B are plan views, illustrating a substantial part of a semiconductor device according to third embodiment.
Figure 9B:
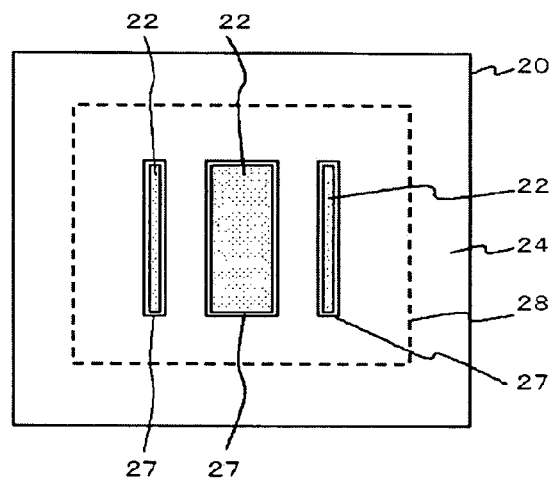

FIGS. 9A and 9B are plan views, illustrating a substantial part of a semiconductor device according to third embodiment.

More specifically, FIG. 9A is a plan view including an enlarged view of a region around bumps-formed region before forming a junction with a first semiconductor chip, and FIG. 9B is a plan view including an enlarged view of a region around bumps-formed region before forming a junction with a second semiconductor chip that is an electronic component.

A semiconductor device of the present embodiment has similar configurations as employed in first embodiment in terms of the configuration of the first semiconductor chip 10, the filling with the underfill resin for the encapsulation or the like, except that openings 27 provided in an insulating film 24 of the second semiconductor chip 20 as shown in FIG. 9B are provided only on bumps-formed regions 22, and is not provided so as to pass through the bumps-formed region 22 and have larger width that a region that extends from an end to another end of the first semiconductor chip 10 (FIG. 9A), which is a counterpart thereof.

Even though the configuration described above is employed, an opening 16 formed in the first semiconductor chip 10 passes through the bumps-formed region 12, and is provided to cover a region corresponding to a region extending from one end to the other end of the first semiconductor chip 10 having the opening 16 provided therein, so that the opening 16 is designed to have its end, which extends to the end of the device mounting region 28 and is not ended within the inside of the device mounting region 28 of the second semiconductor chip 20, such that the opening 16 opens to the end of the coupling surfaces of the first and the second semiconductor chips, similarly as in first embodiment, and therefore, even if air is entrapped in either region of the openings 16 and 27, the air can be easily removed via a defoaming process such as, for example, a vacuum defoaming process before conducting the thermal cure process. Further, since the size of opening in the insulating film that functions a protective film is reduced, as compared with the semiconductor device of first embodiment, a protected area therewith can be increased, thereby providing further improved reliability of the semiconductor device.

Even if a semiconductor device has a COC structure, in which bumps are arranged with fine and reduced intervals and thus it is difficult to be filled with an underfill resin at an uniform rate, the configuration of the semiconductor device according to the present invention can exhibit an inhibition to a generation of voids in the underfill resin for an encapsulation supplied between a semiconductor chip to be coupled and an electronic component.

While the descriptions have been made on semiconductor devices, which includes the second semiconductor chip as the electronic component that is not same as the first semiconductor chip and has the COC structure formed of two semiconductor chips in the embodiments described above, it is not intended to limit the scope of the invention thereto, and similar advantageous effects can also be obtained by employing a semiconductor device composed of a combination of a semiconductor chip and an electronic component except semiconductor chips, such as, for example, an interposer including an electrode, a circuit board and the like, which is an electronic element including bumps formed on a surface thereof and a protective film formed on an uppermost surface thereof.

It is apparent that the present invention is not limited to the above embodiment, that may be modified and changed without departing from the scope and spirit of the invention.

What is claimed is:

1. A semiconductor device, comprising:
a first semiconductor chip including a plurality of first bumps formed on a surface thereof; and
an electronic component including a plurality of second bumps formed on a surface thereof, said electronic component being arranged to be opposed to said first semiconductor chip, each of said first bumps of said first semiconductor chip being joined to corresponding one of said second bumps of said electronic component, which are opposed to said first bumps, respectively, and a gap between said first semiconductor chip and said electronic component being encapsulated with an underfill resin, wherein a first bumps-formed region having plurality of said first bumps arranged thereon is formed partially on said surface of said first semiconductor chip and a second bumps-formed region having plurality of said second bumps arranged thereon is formed partially on said surface of said electronic component, and
wherein a protective film is formed on a portion of at least one of the surface of said first semiconductor chip and the surface of said electronic component except for an excluded area surrounding said first bumps-formed region and/or said second bumps-formed region, the excluded area extending to and being exposed at an edge of said at least one surface and containing said underfill resin.

2. A semiconductor device, comprising:
a first semiconductor component having a first protective film and plural first bumps on a first surface thereof, said first protective film having a first opening in which said plural first bumps are exposed;
a second semiconductor component having a second protective film and plural second bumps on a second surface thereof, said second protective film having a second opening in which said plural second bumps are exposed,
said first and second surfaces facing each other with a space therebetween and with respective ones of said first and second bumps being attached to each other,
said second opening extending beyond and being exposed at a first edge of said first semiconductor component; and
a resin filling said space between said first and second semiconductor components and filling said first and second openings.

3. The semiconductor device of claim 2, wherein said second opening extends beyond and is exposed at a second edge of said first semiconductor component opposite said first edge.

4. The semiconductor device of claim 3, wherein said second opening has a substantially constant width from said first edge to said second edge of said first semiconductor component.

5. The semiconductor device of claim 3, wherein said first opening extends entirely across said first surface in registration with said second opening.

6. The semiconductor device of claim 5, wherein said first opening has a substantially constant width entirely across said first surface.

7. The semiconductor device of claim 2, wherein said first opening extends entirely across said first surface.

8. The semiconductor device of claim 2, wherein at least one of said first and second semiconductor components is a semiconductor chip.

9. The semiconductor device of claim 2, wherein at least one of said first and second semiconductor components is a circuit board.

10. A semiconductor device, comprising:
a first semiconductor component having a first protective film and plural first bumps on a first surface thereof, said first protective film having a first opening in which said plural first bumps are exposed;
a second semiconductor component having a second protective film and plural second bumps on a second surface thereof, said second protective film having a second opening in which said plural second bumps are exposed, said first and second surfaces facing each other with a space therebetween and with respective ones of said first and second bumps being attached to each other, said first opening extending to and being exposed at a first edge of said first semiconductor component; and a resin filling said space between said first and second semiconductor components and filling said first and second openings.

11. The semiconductor device of claim 10, wherein said first opening extends to and is exposed at a second edge of said first semiconductor component opposite said first edge.

12. The semiconductor device of claim 11, wherein said first opening has a substantially constant width from said first edge to said second edge of said first semiconductor component.

13. The semiconductor device of claim 11, wherein said second opening extends partially across said second surface in registration with said first opening.

14. The semiconductor device of claim 13, wherein said second opening has a substantially constant width.

15. The semiconductor device of claim 10, wherein at least one of said first and second semiconductor components is a semiconductor chip.

16. The semiconductor device of claim 10, wherein at least one of said first and second semiconductor components is a circuit board.

* * * * *